United States Patent
Cai et al.

(10) Patent No.: US 9,019,152 B2
(45) Date of Patent: Apr. 28, 2015

(54) STANDARD WAFER AND ITS FABRICATION METHOD

(71) Applicants: BoXiu Cai, Shanghai (CN); YanLei Zu, Shanghai (CN)

(72) Inventors: BoXiu Cai, Shanghai (CN); YanLei Zu, Shanghai (CN)

(73) Assignee: Semiconductor Manufacturing International Corporation (Shanghai), Shanghai (CN)

( * ) Notice: Subject to any disclaimer, the term of this patent is extended or adjusted under 35 U.S.C. 154(b) by 0 days.

(21) Appl. No.: 13/757,063

(22) Filed: Feb. 1, 2013

(65) Prior Publication Data

US 2014/0117235 A1 May 1, 2014

(30) Foreign Application Priority Data

Oct. 29, 2012 (CN) .......................... 2012 1 0419099

(51) Int. Cl.
| | | |
|---|---|---|
| G06K 9/00 | (2006.01) | |
| H01J 37/26 | (2006.01) | |
| H01L 21/28 | (2006.01) | |
| H01L 21/02 | (2006.01) | |

(52) U.S. Cl.
CPC ......... H01J 37/261 (2013.01); *H01L 21/02381* (2013.01); *H01L 21/02439* (2013.01); *H01L 21/02488* (2013.01); *H01L 21/02502* (2013.01); *H01L 21/02521* (2013.01); H01L 21/28088 (2013.01)

(58) Field of Classification Search
CPC .............. H01L 27/1203; H01L 21/84; H01L 29/66772; H01L 27/12; H01L 27/1214; H01L 29/78645; H01L 29/78648; H01L 29/78696; H01L 21/76264; H01L 29/78612
USPC ........... 257/48, 347, 350, 351, 368, 369, 388, 257/411, 412; 438/287–308, 192
See application file for complete search history.

(56) References Cited

U.S. PATENT DOCUMENTS

| | | | | |
|---|---|---|---|---|
| 5,605,854 | A * | 2/1997 | Yoo ............................... | 438/305 |
| 6,015,917 | A * | 1/2000 | Bhandari et al. ................. | 556/12 |
| 2004/0198807 | A1* | 10/2004 | Suzuki et al. .................. | 514/461 |
| 2007/0190780 | A1* | 8/2007 | Chung et al. ................... | 438/675 |
| 2008/0157191 | A1* | 7/2008 | Choi ............................... | 257/330 |
| 2008/0268600 | A1* | 10/2008 | Chan et al. ..................... | 438/299 |
| 2009/0121134 | A1* | 5/2009 | Oosaki et al. .................. | 250/310 |
| 2010/0012990 | A1* | 1/2010 | Kim et al. ...................... | 257/288 |

OTHER PUBLICATIONS

Quirk.M and Serda.J ; Semiconductor Manufacturing Technology; 2001; Prentice Hall; pp. 436 and 454.*

* cited by examiner

*Primary Examiner* — Cuong Q Nguyen
*Assistant Examiner* — Nishath Yasmeen
(74) *Attorney, Agent, or Firm* — Innovation Counsel LLP

(57) ABSTRACT

A standard wafer is provided including a substrate; a first layer of semiconductor material formed on the substrate; a bar formed over the first layer of semiconductor material with an interlayer interposed therebetween; and a first sidewall spacer and a second sidewall spacer formed on the opposite sides of the bar respectively, in which the bar and the first layer of semiconductor material are formed of a same semiconductor material, and the interlayer interposed between the first layer of semiconductor material and the bar is formed of a first oxide, and the first sidewall spacer and the second sidewall spacer are formed of a second oxide. A corresponding fabrication method of the standard wafer is also provided.

14 Claims, 4 Drawing Sheets

STANDARD WAFER AND ITS FABRICATION METHOD

CROSS-REFERENCE TO RELATED APPLICATIONS

This application claims priority to Chinese Patent Application No. 201210419099.X, filed on Oct. 29, 2012 and entitled "STANDARD WAFER AND ITS FABRICATION METHOD", which is incorporated herein by reference in its entirety.

FIELD OF THE INVENTION

The present disclosure relates the field of semiconductor device fabrication, and more particular, to a standard wafer and its fabrication method.

DESCRIPTION OF THE RELATED ART

In semiconductor processes, it is common to use scanning electron microscopes (SEM) to measure critical sizes and other parameters of wafers or devices. As the fundamental operating principle of SEM, a wafer surface is scanned with an electron beam, electron collisions on the wafer surface cause some electrons to break away and exit from the surface of the wafer, and then those secondary electrons are collected and converted to a surface image, which can be displayed on a screen or printed as a picture. In SEM analysis, the wafer and the electron beam need to be arranged in vacuum.

In order to ensure that an SEM is operating properly, it is commonly necessary to perform daily monitoring of the SEM, in which testing and calibration of the SEM is performed. In general, such SEM daily monitoring is performed using standard wafers. Measurements are made on a standard wafer with the SEM. to determine whether the measurement result coincides with the known parameters of the standard wafer (e.g., the critical size of a bar on the standard wafer). If the measurements match the known parameters of the standard wafer, the SEM is operating normally and is properly calibrated (i.e., the operation status of the SEM is normal). If not, the SEM is considered to be operating abnormally (i.e., the operation status is abnormal), and the SEM cannot, without further modification and/or calibration, be used to make accurate and reliable measurements.

It can be understood from the operation principles of SEMS that measuring a standard wafer with an SEM may cause impacts on the standard wafer itself. For example, electron collision on the surface of the standard wafer may destroy the structure of the standard wafer. Such destruction of the structure of the standard wafer can make any measurements made on the wafer inaccurate when the standard wafer is used in subsequent measurements, making it impossible to determine whether the SEM is in a normal operation state. Therefore, it is desirable to provide a stable standard wafer that is not liable to be destroyed in repeated use.

In industrial applications, the operation status of an SEM maybe sensitive to various factors, thus it is important to perform routine monitoring to make sure that the SEM maintains a normal operation status. In such a case, it is necessary to frequently (for example, every day) perform routine monitoring on an SEM with standard wafers. Therefore, it is desirable to fabricate such standard wafers at a low cost and through simple fabrication processes.

One type of standard wafer currently in use is referred to as a "Golden wafer". Golden wafers are generally fabricated through complicated processes that are expensive, and hence such Golden wafers are unsuitable for routine monitoring of SEMS.

Another type of standard wafer that is commonly employed is a polysilicon wafer. Polysilicon wafers are relatively stable, but are prone to the occurrence of residual electrons, and thus are liable to contamination. In order to prevent the occurrence of remaining residual electrons, a layer of metal may be coated on the wafer. Due to the conductive nature of the metal layer, remaining residual electrons do not occur. However, the conductive nature also results in substantially no secondary electrons, which are needed to make the measurement, being produced. Therefore, under the SEM, it is difficult to clearly observe structural morphology of the wafer surface. In such a case, due to the resulting low material contrast, the topology of such a metal coated polysilicon standard wafer observed through the SEM is not clear.

Hence, it is desirable to provide a standard wafer suitable for routine monitoring of SEMS, which is not prone to be charged and is not liable to be contaminated. Further, it is desirable that the standard wafer has high imaging contrast.

SUMMARY OF THE INVENTION

This disclosure relates to a standard wafer and its fabrication method. Briefly, through forming bars on the standard wafer and sidewall spacers on the opposite sides of the bars by a semiconductor material and an oxide having high imaging contrast under an SEM, respectively, the standard wafer is suitable for, for example, routine monitoring of the SEM.

In one aspect, a standard wafer is provided, including: a substrate; a first layer of semiconductor material formed on the substrate; a bar formed over the first layer of semiconductor material with an interlayer interposed therebetween; and a first sidewall spacer and a second sidewall spacer formed on the opposite sides of the bar respectively, wherein the bar and the first layer of semiconductor material are formed of a same semiconductor material, and the interlayer interposed between the first layer of semiconductor material and the bar is formed of a first oxide, the first sidewall spacer and the second sidewall spacer are formed of a second oxide.

The semiconductor material may be a metal nitride.
The metal nitride may be TiN.
The metal nitride may be TaN.
The substrate may be a Si substrate.
The first oxide and the second oxide may both be $SiO_2$.
The thickness of the interlayer interposed between the first layer of semiconductor material and the bar may range from 5 to 10 nm.

In another aspect of this disclosure, a standard wafer fabrication method is provided, including: forming a first layer of semiconductor material on a substrate; forming a first layer of oxide on the first layer of semiconductor material; forming a second layer of semiconductor material on the first layer of oxide; patterning the second layer of semiconductor material to form bars; forming a second layer of oxide on the bars and the first layer of oxide; etching the first layer of oxide and the second layer of oxide to completely remove the second layer of oxide on top of the bars and expose the first layer of semiconductor material, the second layer of oxide remaining on the opposite sides of each of the bars forming a first sidewall spacer and a second sidewall spacer respectively, wherein the first layer of semiconductor material and the second layer of semiconductor material are formed of a same semiconductor material.

The semiconductor material may be a metal nitride.
The metal nitride may be TiN.

The metal nitride may be TaN.

The substrate may be a Si substrate.

The first layer of oxide and the second layer of oxide may be $SiO_2$.

Before etching the first layer of oxide and the second layer of oxide, the thickness of the first layer of oxide may be larger than or equal to the thickness of the second layer of oxide.

The thickness of the first layer of oxide may ranges from 5 nm to 10 nm.

The thickness of the second layer of oxide may range from 5 nm to 7 nm.

Forming the first layer of semiconductor material may include forming the first layer of semiconductor material on the substrate through vacuum evaporation, sputtering chemical vapor deposition (CVD), atomic layer deposition (ALD) or physical vapor deposition (PVD).

Forming the second layer of semiconductor material may include forming the second layer of semiconductor material on the first layer of oxide through vacuum evaporation, sputtering chemical vapor deposition (CVD), atomic layer deposition (ALD) or physical vapor deposition (PVD).

Etching the first layer of oxide and the second layer of oxide may include dry etching.

The dry etching may include plasma etching, ion beam etching, or reactive ion etching.

Other features and advantages of this disclosure will become apparent from the detailed description of exemplary embodiments of this disclosure given below with reference to accompanying drawings.

BRIEF DESCRIPTION OF THE DRAWINGS

The accompanying drawings, which are incorporated in and constitute a part of the specification, illustrate embodiments of the disclosure and, together with the description, serve to explain the principles of the disclosure.

With reference to those drawings, from the following detailed description, this disclosure can be understood more clearly, wherein.

DESCRIPTION OF THE EMBODIMENTS

Figure 1:
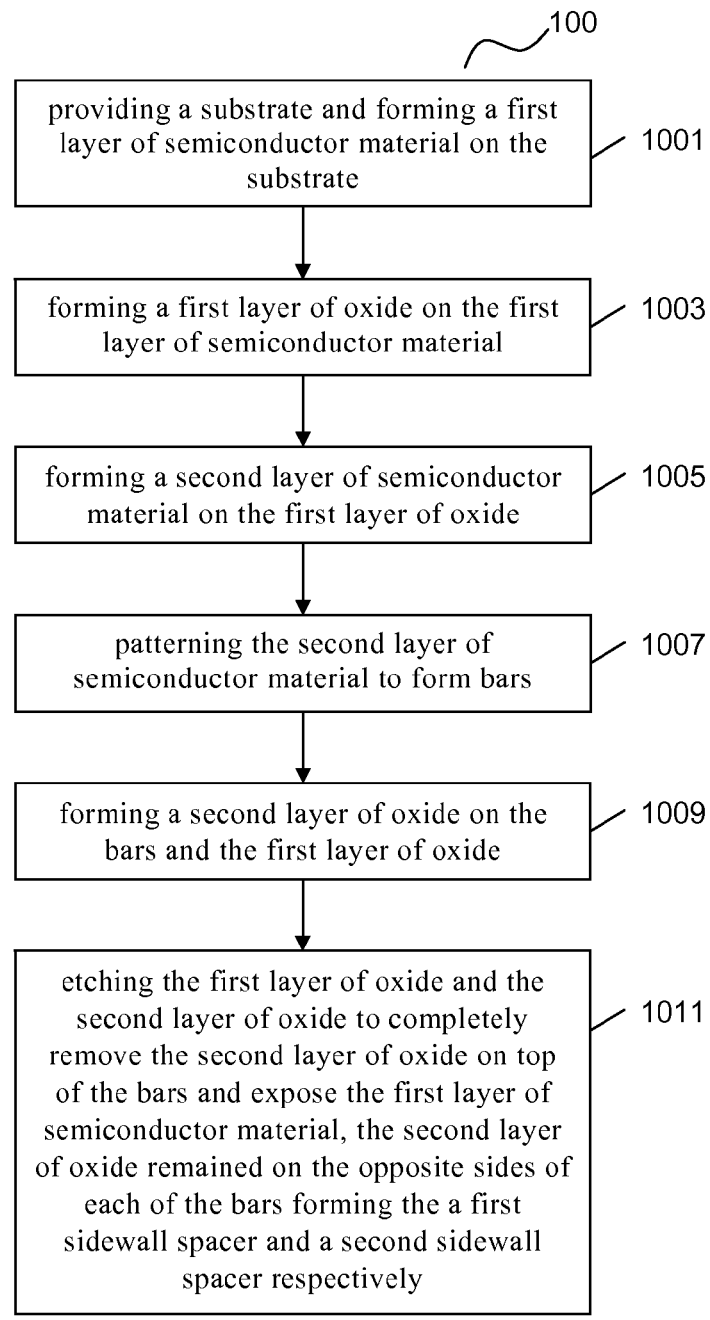
FIG. 1 shows a flowchart of a process of fabricating a standard wafer according to an embodiment of this disclosure.

Various exemplary embodiments of the present disclosure will now be described with reference to the drawings. It should be noted that the relative arrangement of the components and steps, the numerical expressions, and numerical values set forth in these embodiments do not limit the scope of the present disclosure unless it is specifically stated otherwise.

For the convenience of description, various parts shown in those drawings are not necessarily drawn on scale. The following description of at least one exemplary embodiment is merely illustrative in nature and is in no way intended to limit the disclosure, its application, or uses.

Techniques, methods and apparatus as known by one of ordinary skill in the relevant art may not be discussed in detail, but are intended to be part of the specification where appropriate.

In all of the examples illustrated and discussed herein, any specific values should be interpreted to be illustrative only and non-limiting. Thus, other examples of the exemplary embodiments could have different values.

Similar reference numerals and letters refer to similar items in the following figures, and thus once an item is defined in one figure, it is possible that it need not be further discussed for following figures.

While not wishing to be bound by any particular theory, in general, damages to standard wafers during SEM measurement have two sources. First, when electrons strike a standard wafer, some electrons may stay in the standard wafer, and, as a result, the originally uncharged standard wafer will turn into a charged wafer. When an SEM emits an electron beam to a charged standard wafer, like charges repel, and the generation of secondary electrons may be impacted, so that the measurement result will become inaccurate. Secondly, after a standard wafer is scanned by an SEM, its surface chemical properties may vary, when the standard wafer is placed in air, the surface of the wafer is prone to become contaminated due to such changes. Therefore, it is desirable to have a standard wafer in which, when an electron beam strikes the standard wafer, no electrons remain on the wafer, so that the wafer is relatively stable and is not prone to be contaminated.

Figure 2A:
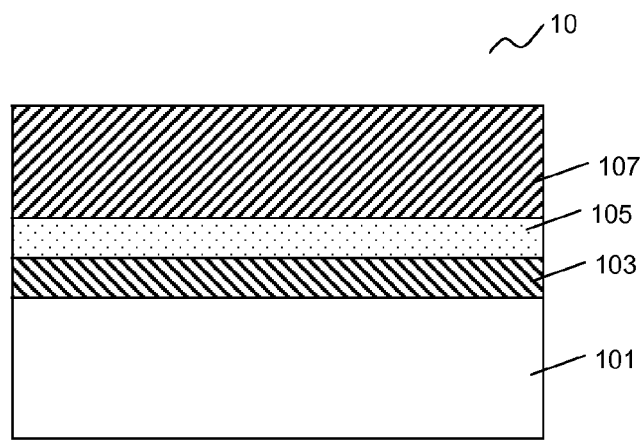
FIG. 2A to FIG. 2D show sectional views of structures obtained in various stages of the standard wafer fabrication process shown in the flowchart of FIG. 1.

Furthermore, when scanning a standard wafer with an SEM, the measurement result is impacted by not only the structure of the wafer surface (morphology), but also by the surface material of the wafer. That is, in the measurement result, the morphology of the wafer surface structure may render light-dark variations, and different materials of the crystal surface structure may render light-dark variations also. In other words, light-dark variations in the measurement result may represent morphology contrasts in structure or just material contrasts not specific to the structure. Ideally, in the measurement result of a SEM, light-dark variations observed in the image are directly related to structural morphology in the standard wafer. A standard wafer and its fabrication method according to an embodiment of this disclosure will be described in detail below with reference to FIG. 1 to FIG. 2E. FIG. 1 shows a flowchart of a process of fabricating a standard wafer according to an embodiment of this disclosure, FIGS. 2A to 2D show sectional views of structures obtained in various stages of the standard wafer fabrication process shown in the flowchart of FIG. 1, and FIG. 2E is a top view of the standard wafer according to an embodiment of this disclosure.

FIG.1 shows a flowchart of a method 100 for fabricating a standard wafer according to an embodiment of this disclosure. The method begins at 1001, in which a substrate 101 is provided, and a first layer of semiconductor material 103 is formed on the substrate 101, as shown in FIG.2A. Next, at 1003 of FIG.1, a first layer of oxide 105 is formed on the first layer of semiconductor material 103, as shown in FIG.2A.

In this example, the substrate 101 may be a Si substrate. However, this disclosure is not limited thereto, for example, the substrate 101 may be any other type of substrate that is commonly used in semiconductor processes.

The first layer of semiconductor material 103 can be formed from various appropriate semiconductor materials. According to this disclosure, when selecting the semiconductor material for the first layer of semiconductor material 103, a semiconductor material that has at least one or two of the following four characteristics can be considered:

(1) the semiconductor material has high electrical conductivity, that is, it has good conductive performance;

(2) the semiconductor material has a strong affinity for the oxide of the first layer of oxide 105, that is, it has good adhesiveness to the oxide;

(3) the semiconductor material has a higher etch selectivity ratio with respect to the oxide of the first layer of oxide 105; and (4) the semiconductor material has high chemical stability, and does not tend to diffuse when struck by a beam of electrons, and thus is relative stable.

The semiconductor material may be, for example, a metal nitride. The metal nitride may for example include, but is not limited to, TiN and TaN.

In this example, the semiconductor material is for example TiN. TiN is a semiconductor material composed of ionic bonds, covalent bonds and metallic bonds in a mixed manner. As a result of its structure, TiN has excellent characteristics, such as high temperature resistance, corrosion resistance, high hardness, good chemical stability, etc. TiN has a conduction performance that is approximately comparable to that of metal, and thus has a high conductivity. For example, TiN may have a conductivity of 30 microhm/cm.

TiN is merely an example which is used to illustrate the principle of this disclosure. The semiconductor material used in the standard wafer may be any other semiconductor material currently known or that maybe discovered in the future that includes at least one or two of the four characteristics described above: good conductivity, good adhesiveness to oxides, a higher etch selectivity ratio as compared to oxides, and stable chemical characteristics.

In some embodiments, the method used to form the first layer of semiconductor material 103 may include forming the first layer of semiconductor material 103 on the substrate 101 through vacuum evaporation, sputtering chemical vapor deposition (CVD), atomic layer deposition (ALD) or physical vapor deposition (PVD).

The first layer of oxide 105 may be formed of various oxide materials. For example, the first layer of oxide 105 may be a layer of $SiO_2$. The first layer of oxide 105 maybe very thin. For example, the first layer of oxide 105 may be in a range of 5 nm to 10 nm. The first layer of oxide 105 may also have another thickness.

Referring to FIG.1 again, at 1005 of FIG.1, a second layer of semiconductor material 107 is formed on the first layer of oxide 105, as shown in FIG.2A. The second layer of semiconductor material 107 is formed of the same semiconductor material as the first layer of semiconductor material 103. For example, in some embodiments, the second layer of semiconductor material 107 and first layer of semiconductor material 103 are both formed of a same metal nitride. In one embodiment, the second layer of semiconductor material 107 and first layer of semiconductor material 103 are both formed of TiN. In other embodiments, the second layer of semiconductor material 107 and first layer of semiconductor material 103 are both formed of TaN.

The method of forming the second layer of semiconductor material 107 may include forming the second layer of semiconductor material 107 on the first layer of oxide 105 through vacuum evaporation, sputtering chemical vapor deposition (CVD), atomic layer deposition (ALD) or physical vapor deposition (PVD). The manner of forming the second layer of semiconductor material 107 on the first layer of oxide 105 may or may not be the same as that used for forming the first layer of semiconductor material 103 on the substrate 101. In an embodiment, the thickness of the second layer of semiconductor material 107 may be larger than that of the first layer of semiconductor material 103.

Figure 2B:
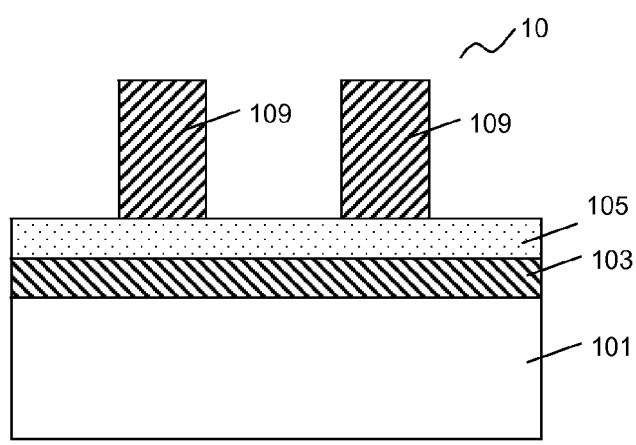

Next, at 1007 of FIG.1, the second layer of semiconductor material 107 is patterned to form bars 109, as shown in FIG.2B. FIG.2B shows a sectional view of the patterned wafer. Note that although only two bars 109 are shown in FIG.2B for clarity, it should be understood that the number of bars 109 is not limited thereto. Any number of bars 109 can be formed as appropriate. For example, the number of bars may be one, three, or more than three.

Patterning the second layer of semiconductor material 107 to form bars 109 includes the alignment and exposure, development, etching, and removal of a photoresist.

Particularly, for example, after surface preparing (for example, washing and drying)of the wafer 10 obtained through 1001 to 1005 shown in FIG.2A, a film of photoresist is coated on the surface of the wafer 10 through, for example, spin coating or vapour deposition. Then, some solvent of the photoresist is evaporated through heating. After which a mask is accurately aligned with the wafer 10 to make the photoresist exposure. Particularly, alignment and exposure include locating or aligning a required pattern (in this example, a pattern constituted by bars) on the surface of the wafer 10, and then transferring the pattern to the layer of photoresist using an exposing light or other radiation source. After completing the alignment and exposure of the wafer 10, a required pattern is recorded on the photoresist in the form of exposed areas and unexposed areas. At that point, the photoresist is developed through chemical decomposition of the unpolymerized photoresist. After completing the development, and possibly a development test, the pattern of the mask is fixed on the photoresist. At that point, the wafer 10 is etched to obtain side edges substantially vertical to the substrate. The etching may employ dry etching, for example, plasma etching, ion beam etching, and reactive ion etching .In an embodiment, for example, plasma etching (also called as sputter etching or ion beam milling) or ion beam etching can be used, in which the surface of the wafer 10 is bombarded with an ion beam along the direction vertical to the substrate of the wafer 10 (perpendicular to the surface of the substrate of the wafer 10) to form side edges substantially vertical to the substrate, so that bars 109 shown in FIG.2B are obtained. As described above, the semiconductor material of the second layer of semiconductor material 107 has a higher etching selection rate with respect to the first layer of oxide 105, which may be advantageous to form bars 109 with vertical side edges, while preventing the first layer of oxide 105 from becoming over-etched.

The above is a simple description of a method for patterning the second layer of semiconductor material 107 to form bars 109, those of ordinary skill in the art will understand that any method that is suitable to pattern the second layer of semiconductor material 107 to form bars 109 can be applicable to this disclosure, and these methods can be combined in any manners. For example, a positive photoresist or negative photoresist can be employed as the photoresist. For example, although only dry etching is described above, in some situations however, wet etching can be used.

Figure 2C:
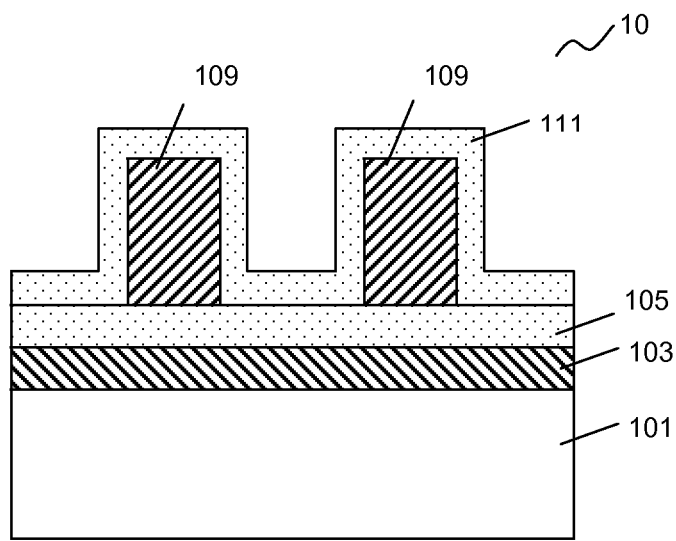

Next, at 1009 of FIG.1, a second layer of oxide 111 is formed on the bars 109 and the first layer of oxide 105, as shown in FIG.2C. In some embodiments, the second layer of oxide 111 and the first layer of oxide 105 can be formed of the same oxide. For example, in an embodiment, both the second layer of oxide 111 and the first layer of oxide 105 may be a layer of $SiO_2$. In some embodiments, the thickness of the second layer of oxide 111 may be less than that of the first layer of oxide 105. The second layer of oxide 111 can be very thin. For example, the second layer of oxide 111 may have a thickness in the range of 5 nm to 7 nm.

Figure 2D:
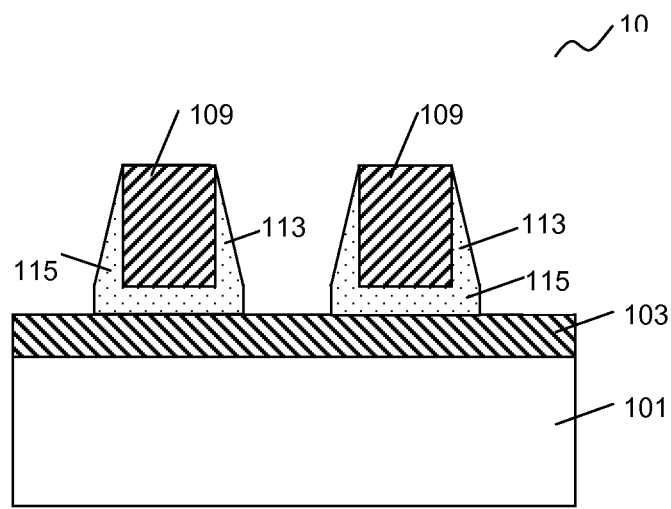
Figure 2E:
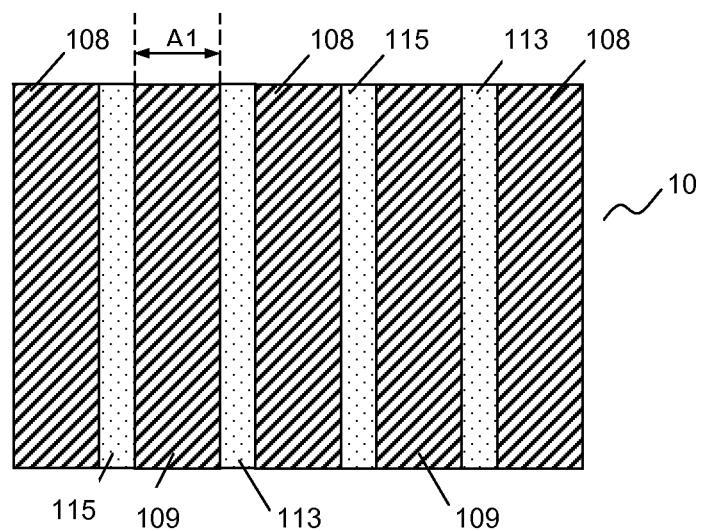
FIG. 2E is a top view of the standard wafer according to an embodiment of this disclosure.

Next, at 1011 of FIG.1, the first layer of oxide 105 and the second layer of oxide 111 are etched to completely remove the second layer of oxide 111 on the top of the bars 109 and expose the first layer of semiconductor material 103. Some of the second layer of oxide remains along the opposite sides of each bar 109 forming a first sidewall spacer 115 and a second sidewall spacer 113, respectively, as shown in FIG.2D. In some embodiments, etching the first layer of oxide 105 and the second layer of oxide 111 includes dry etching. In some embodiments, the dry etching for example includes, but is not limited to, plasma etching, ion beam etching, and reactive ion etching. In an embodiment, ion beam etching (also called as sputter etching or ion beam milling) or reactive ion etching can be used, in which the surface of the wafer 10 is bombarded with an ion beam along the direction vertical to the substrate of the wafer 10, to completely remove the second layer of oxide 111 on the top of the bars 109 and expose the first layer of semiconductor material 103. The second layer of oxide that remains along the opposite sides of each bar 109 forms a first sidewall spacer 115 and a second sidewall spacer 113, respectively, so that a wafer structure shown in FIG.2D is obtained. When etched, the etching process is performed taking into consideration the total thickness of the second layer of oxide 111 and the first layer of oxide 105. As described above, the semiconductor material of the first layer of semiconductor material 103 and the second layer of semiconductor material 107 (more precisely, bars 109) have a higher etching selection rate with respect to the oxide of the first layer of oxide 105 and the second layer of oxide 111, which is also advantageous to form the wafer structure shown in FIG.2D. In particular, the first sidewall spacer 115 and the second sidewall spacer 113, prevent the first layer of semiconductor material 103 and the bars 109 from becoming over-etched.

FIG. 2E shows a top view of the standard wafer 10 according to an embodiment of this disclosure as shown in FIG. 2D. The use of the standard wafer 10 in routine SEM monitoring will be described below with reference to FIG. 2E. When the standard wafer 10 is placed and observed under an SEM, light-dark alternating stripes can be clearly observed. The stripes 109 represent stripes resulting from bars 109 of FIG. 2C, stripes 115 and 113 represent stripes resulting from the first sidewall spacer 115 and the second sidewall spacer 113 on the opposite sides of each bar 109 of FIG. 2C, and stripes 108 represent stripes resulting from the exposed portions of the first layer of semiconductor material 103, i.e., stripes of portions that are not blocked by the bars 109 and the sidewall spacers 115 and 113. Because the semiconductor material of the bars 109 and the first layer of semiconductor material 103 have a conductivity that is similar to the conductivity of metal, i.e., a high conductivity, when the wafer 10 is placed under the SEM and scanned, electrons can be drawn away rapidly. Thus, no, or fewer, secondary electrons are excited from the bars 109 and the exposed portions 108 of the first layer of semiconductor material 103, so that, in the observed image, they correspond to dark stripes. On the other hand, the sidewall spacers 115 and 113 are formed of oxide, and thus have a low conductivity. When the wafer 10 is placed under the SEM and scanned, no electrons can be drawn away. Thus, there are more secondary electrons excited from the sidewall spacers 115 and 113, so that in the observed image, they correspond to bright stripes. Because the sidewall spacers 115 and 113 can be made very thin, when observed under the SEM, they may just look like two fine lines. When for example the size of the bar 109, i.e. width A1, is required to be measured, the distance between the sidewall spacers 115 and 113 (two fine lines in the image) on the opposite sides of each bar 109 can be measured. Because there is a significant difference in conductivity between the semiconductor material of the bars 109 and the exposed portions 108 of the first layer of semiconductor material 103 on one hand, and the oxide of the sidewall spacers 115 and 113 on the other hand, the image observed under the SEM has a high contrast, and a clear pattern is observed.

Because the majority of the surface of the wafer 10 is a semiconductor material having a conductivity similar to the conductivity of metal, and only a small portion of the wafer 10 is oxide, only a few electrons remain on the wafer 10. As a result, the wafer 10 is not liable to be charged upon SEM scanning. When the wafer 10 is returned to a normal environment from a vacuum environment, it is not prone to be contaminated. Therefore standard wafer 10 may be used repeatedly without damage, and it is suitable for routine SEM monitoring.

Further, as described above, although the semiconductor material has a conductivity that is similar to the conductivity of metal, it has, at the same time, higher chemical stability, and little or no diffusion tends to occur under the collision of an electron beam. So the semiconductor material used in wafer 10 is more stable. Because of the stability of the semiconductor material, the semiconductor material/oxide interface between the bars 109 and the exposed portion 108 of the first layer of semiconductor material 103, and the sidewall spacers 115 and 113 is chemically stable. This further stability also enables the repeated use of the wafer 10 according to embodiments of this disclosure, i.e., making the wafer 10 suitable for routine SEM monitoring.

Furthermore, the semiconductor material used in wafer 10 has a strong affinity with the oxide, that is, it has good adhesiveness to the oxide, which also enables the repeated use of the wafer 10 according to embodiments of this disclosure, i.e., making the wafer 10 suitable for routine SEM monitoring.

Further, the fabrication process of fabricating the wafer 10 as described in FIG. 1 is relatively simple, resulting lower cost, which is advantageous in that it allows a larger scale of fabrication and usage. The ability to fabricate the standard wafer on a large scale also makes the wafer 10 according to embodiments of this disclosure suitable for routine SEM monitoring.

A standard wafer and its fabrication method according to embodiments of this disclosure have been described in detail. Some well known details are not described herein in order to prevent obscuring the concept of this disclosure. From the above description, those skilled in the art may fully understand how to implement the technical solutions disclosed herein.

Although some specific embodiments of the present disclosure have been demonstrated in detail with examples, it is understood that the above examples are only intended to be illustrative but not to limit the scope of the present disclosure. It is understood that the above embodiments can be modified without departing from the scope and spirit of the present disclosure, including the attached claims.

What is claimed is:

1. A standard wafer fabrication method, consisting of:
   forming a first layer of semiconductor material on a substrate;
   forming a first layer of oxide on the first layer of semiconductor material;
   forming a second layer of semiconductor material on the first layer of oxide;
   patterning the second layer of semiconductor material to form two or more bars;

forming a second layer of oxide on the bars and the first layer of oxide; and etching the first layer of oxide and the second layer of oxide to completely remove the second layer of oxide on top of the bars and to remove the first layer of oxide on the first layer of semiconductor material between the bars to expose the first layer of semiconductor material between the bars, the second layer of oxide remaining on the opposite sides of each of the bars forming a first sidewall spacer and a second sidewall spacer respectively.

2. The fabrication method according to claim 1, wherein the semiconductor material is a metal nitride.

3. The fabrication method according to claim 2, wherein the metal nitride is TiN.

4. The fabrication method according to claim 2, wherein the metal nitride is TaN.

5. The fabrication method according to claim 1, wherein the substrate is a Si substrate.

6. The fabrication method according to claim 1, wherein the first layer of oxide and the second layer of oxide is SiO2.

7. The fabrication method according to claim 1, wherein before etching the first layer of oxide and the second layer of oxide, the thickness of the first layer of oxide is larger than or equal to the thickness of the second layer of oxide.

8. The fabrication method according to claim 7, wherein the thickness of the first layer of oxide ranges from 5 nm to 10 nm.

9. The fabrication method according to claim 7 or claim 8, wherein the thickness of the second layer of oxide ranges from 5 to 7 nm.

10. The fabrication method according to claim 1, wherein forming the first layer of semiconductor material comprises forming the first layer of semiconductor material on the substrate through at least one of vacuum evaporation, sputtering chemical vapor deposition (CVD), atomic layer deposition (ALD) and physical vapor deposition (PVD).

11. The fabrication method according to claim 1, wherein forming the second layer of semiconductor material comprises forming the second layer of semiconductor material on the first layer of oxide through at least one of vacuum evaporation, sputtering chemical vapor deposition (CVD), atomic layer deposition (ALD) and physical vapor deposition (PVD).

12. The fabrication method according to claim 1, wherein etching the first layer of oxide and the second layer of oxide comprises dry etching.

13. The fabrication method according to claim 12, wherein the dry etching comprises at least one of plasma etching, ion beam etching, and reactive ion etching.

14. The fabrication method according to claim 1, wherein the first sidewall spacer and the second sidewall spacer extend along the length of and substantially parallel to at least one of the two or more bars.

* * * * *